US009558661B2

(12) United States Patent
Shi et al.

(10) Patent No.: US 9,558,661 B2
(45) Date of Patent: Jan. 31, 2017

(54) METHOD FOR TRAFFIC FLOW PREDICTION BASED ON SPATIO-TEMPORAL CORRELATION MINING

(71) Applicant: FUDAN UNIVERSITY, Shanghai (CN)

(72) Inventors: Shixiong Shi, Shanghai (CN); Su Yang, Shanghai (CN)

(73) Assignee: FUDAN UNIVERSITY, Shanghai (CN)

( * ) Notice: Subject to any disclaimer, the term of this patent is extended or adjusted under 35 U.S.C. 154(b) by 0 days.

(21) Appl. No.: 15/197,155

(22) Filed: Jun. 29, 2016

(65) Prior Publication Data

US 2016/0314686 A1 Oct. 27, 2016

Related U.S. Application Data

(63) Continuation of application No. PCT/CN2014/081350, filed on Jul. 1, 2014.

(30) Foreign Application Priority Data

Dec. 30, 2013 (CN) .......................... 2013 1 0749807

(51) Int. Cl.
   *G06F 17/00* (2006.01)
   *G08G 1/01* (2006.01)
   *G06N 99/00* (2010.01)
   *G06F 17/50* (2006.01)
   *G06F 17/16* (2006.01)

(52) U.S. Cl.
   CPC ............ *G08G 1/0125* (2013.01); *G06F 17/16* (2013.01); *G06F 17/5009* (2013.01); *G06N 99/005* (2013.01); *G08G 1/0137* (2013.01)

(58) Field of Classification Search
   None
   See application file for complete search history.

(56) References Cited

U.S. PATENT DOCUMENTS

| 5,696,503 A * | 12/1997 | Nasburg | G08G 1/0104 |
| | | | 340/933 |
| 2002/0026278 A1* | 2/2002 | Feldman | G08G 1/0104 |
| | | | 701/117 |
| 2009/0327478 A1* | 12/2009 | Krause | G06Q 10/04 |
| | | | 709/224 |

OTHER PUBLICATIONS

Bishop, Christopher M, "Neural Networks for Pattern Recognition," Claredon Press, Oxford, 1995.
(Continued)

*Primary Examiner* — Adam Alharbi
(74) *Attorney, Agent, or Firm* — Kilpatrick Townsend & Stockton LLP

(57) ABSTRACT

The disclosure includes a method for traffic flow prediction based on data mining on spatio-temporal correlations. The method includes establishing a prediction model, data mining on spatio-temporal correlations, and traffic flow prediction based on spatio-temporal correlated data. The prediction model can be a linear regression model with multiple variables. The data mining on spatio-temporal correlations is based on a multi-factor linear regression model and by means of the optimization method in terms of sparse representation. The data from the spatio-temporal correlated sensors that are relevant to the prediction task are determined automatically. The traffic flow prediction based on spatio-temporal correlated data refers to that the prediction is performed with the input to the prediction model to be the data from the spatio-temporal correlated sensors.

4 Claims, 1 Drawing Sheet

(56) References Cited

OTHER PUBLICATIONS

Williams, Billy M. et al., "Urban Freeway Traffic Flow Prediction," Transportation Research Record, vol. 1644, Paper No. 98-0463, 1998, pp. 132-141.
Smith, Brian L. et al., "Comparison of Parametric and Nonparametric Models for Traffic Flow Forecasting," Transportation Research Part C, vol. 10, 2002, pp. 303-321.
Stathopoulos, Anthony, et al., "A Mulitvariate State Space Approach for Urban Traffic Flow Modeling and Prediction," Transportation Research Part C, vol. 11, 2003, pp. 121-135.
Tropp, J. A., "Greed is Good: Algorithmic Results for Sparse Approximation," Orthogonal Matching Pursuit, 2004.
Efron, Bradley, et al., "Least Angle Regression." Annals of Statistics, vol. 32, No. 2, Stanford University, 2004, pp. 407-499.
Vlahogianni, Eleni I., et al., "Optimized and Meta-Optimized Neural Networks for Short-Term Traffic Flow Prediction: A Genetic Approach," Transportation Research Part C, vol. 13, 2005, pp. 211-234.
Elad, Michael, "Sparse and Redundant Representations—From Theory to Applications in Signal and Image Processing," The Technion-Israel Institute of Technology, Haifa, Israel, Springer, 2010, pp. 1-397.
Min, Wanli, et al., "Real-Time Road Traffic Prediction With Spatio-Temporal Correlations," Transportation Research Part C, vol. 19, 2011, pp. 606-616.
Minnesota Department of Transportation, Regional Transportation Management Center, "Metropolitan Freeway System 2012 Congestion Report," Metro District Office of Operations and Maintenance, Jan. 2013.

\* cited by examiner

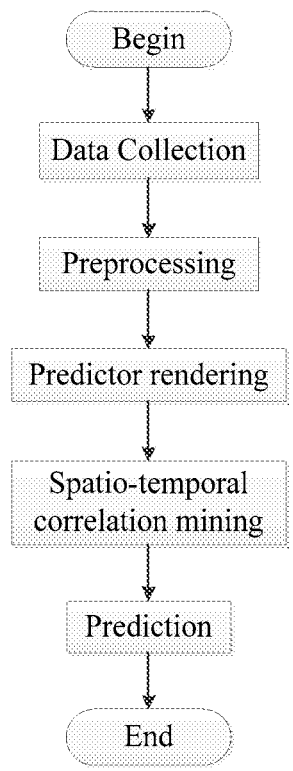

METHOD FOR TRAFFIC FLOW PREDICTION BASED ON SPATIO-TEMPORAL CORRELATION MINING

CROSS-REFERENCES TO RELATED APPLICATIONS

The present application is a continuation of International Application No. PCT/CN2014/081350, filed Jul. 1, 2014, which claims priority to Chinese Patent Application No. CN201310749807.0, filed Dec. 30, 2013, which applications are incorporated herein by reference in their entirety.

FIELD OF THE INVENTION

The invention relates to traffic flow prediction, and more particularly, to predicting traffic flow based on data mining on spatio-temporal correlations.

BACKGROUND

In recent years, traffic flow prediction has been playing an important role in Intelligent Transportation Systems (ITS), which provides decision support for intelligent personal route planning as well as for transportation administration.

Early studies are mainly focused on traffic flow prediction based on single time series. The prediction models can be sorted into two categories: parametric and nonparametric methodologies. For parametric models, seasonal ARIMA (Autoregressive Integrate Moving Average) is the most widely used method (see reference [1]), which aims to approach minimum squared error (MSE) for traffic flow prediction over single time series. As for nonparametric models, Nearest Neighbor Method is regarded as an alternative solution to ARIMA (see reference [2]). However, its performance is subject to the quality of the historical data. Overall, traffic flow prediction based on single time series simply takes into account the characteristics of the time series itself but neglects the interactions and relations among different time series.

Since the evolution of traffic flows is the outcome of the interactions among the traffic flows at all the nodes in the road network of interest, the relations across the nodes should be taken into account for traffic flow prediction. Correspondingly, the recent trend has been shifted to study the multi-variable prediction models based on spatio-temporal correlations among traffic data. The prevailing methods can be sorted into 3 categories: (1) State space model or Kalman filter (see reference [3]); (2) Machine learning such as Neural Networks (see reference [4]); (3) Time series methods such as Vector Autoregressive Moving Average (VARMA) module (see reference [5]). Nevertheless, determining spatio-temporal correlation is essential for multi-variable traffic flow prediction. In previous studies, the spatio-temporal correlated sensors are determined empirically and manually, and confined within the neighborhood around the target node to some extent. Such a scheme to select input variables is too subjective to approach the best performance in terms of prediction due to the less consideration of the reality, say, the spatio-temporal correlations among traffic data. Moreover, the variable selection based on human experience cannot be generalized to be applicable to large-scale road networks.

As a mathematical tool, sparse representation has been applied to signal processing very early such as signal compression, image deblurring, and feature extraction. Certain embodiments of the present invention aim to apply it to spatio-temporal correlation mining for traffic flow prediction. The basic idea of sparse representation is as follows. A signal y can be represented as a linear combination of K primitives $\{d_1, d_2, \ldots, d_j, \ldots, d_K\}$ in a dictionary D, that is, $y = Dx$, where $y \in R^n$, $d_j \in R^n$, and $D \in R^{n \times K}$. Approximately, it can be represented as $y \approx Dx$, where $\|y - Dx\|_2^2 \leq \epsilon_0$ and $x \in R^K$ are the coefficients to reconstruct y. Sparse representation aims to reconstruct y with as few as possible primitives, that is, x should contain as less as possible nonzero coefficients to render the linear combination. Hence, the objective to be optimized in the sense of sparse representation can be formulated as $$\hat{x} = \arg\min_x \|x\|_0 \quad \text{subject to} \quad y = Dx$$

or $$\hat{x} = \arg\min_x \|x\|_0 \quad \text{subject to} \quad \|y - Dx\|_2^2 \leq \epsilon_0$$

where $\|x\|_0$ means the $l^0$ norm of x, namely, the number of nonzero elements contained in vector x. Since a couple of optimization methods have been developed in the context of sparse representation [6], which are able to select the corresponding primitives from the dictionary in correspondence to the nonzero coefficients in a fully automatic manner, certain embodiments of the present invention employ such methods to discover the spatio-temporal correlations among traffic data so as to determine the correlated sensors in the whole road network that are highly contributive to the prediction task to be performed at the target sensor, and apply the data collected from such correlated sensors as the input to the predictor for the sake of traffic flow prediction.

REFERENCES

[1] Williams, B. M., Durvasula, P. K., Brown, D. E., 1998, "Urban freeway traffic flow prediction: Application of seasonal autoregressive integrated moving average and exponential smoothing models." Transportation Research Record Vol. 1644, pp. 132-144.

[2] Smith, B. L., Williams, B. M., Oswalsd, R. K., 2002, "Comparison of parametric and nonparametric models for traffic flow forecasting." Transportation Research Part C Vol. 10, pp. 303-321.

[3] Stathopouos, A., Karlaftis, A., S., 2003, "A multivariate state space approach for urban traffic flow modeling and prediction." Transportation Research Part C, Vol. 11, pp. 121-135.

[4] Vlahogianni, E. I., Karlaftis, M. G., Golias, J. C., 2005, "Optimized and meta-optimized neural networks for short-term traffic flow prediction: a genetic approach." Transportation Research Part C Vol. 13, pp. 211-234.

[5] Min, W., Wynter, L., 2011, "Real-time road traffic prediction with spatio-temporal correlations." Transportation Research Part C Vol. 19, pp. 606-616.

[6] Elad, M., 2010, "Sparse and redundant representations-From theory to application in signal and image processing." Springer.

BRIEF SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Certain embodiments of the present invention aims to tackle the problem of the exiting traffic flow prediction technologies in terms of discovering spatio-temporal correlated data. A method for traffic flow prediction based on spatio-temporal correlation mining is proposed according to certain embodiments of the present invention to determine automatically the spatio-temporal correlated sensors from the whole road network with regard to the target sensor conducting prediction.

The spatio-temporal correlation mining based traffic prediction method proposed in certain embodiments of the present invention comprises the following steps:

(a) Collect the raw data of traffic flows through the sensors distributed at the nodes all over the road network.

(b) Preprocess the raw data of traffic flows into valid traffic flow data.

(c) Prediction model (predictor) rendering: Let $v_i^j$ represent the traffic volume sampled at sensor j at time i. Suppose that there are in total m sensors in the road network of interest and the state of the whole road network at time i is denoted as $V_i=[v_i^1, v_i^2, \ldots, v_i^m]$. The linear regression based predictor to predict the traffic volume at sensor j with time lag $\tau$ is $$\bar{v}_{i+\tau}^j = V_i w^j$$

where the weights $w^j=[w_1^j, w_2^j, \ldots w_k^j, \ldots w_m^j]^T$ are the parameters to be optimized and $\bar{v}_{i+\tau}^j$ is the predicted traffic volume.

(d) Mining spatio-temporal correlations: Applying the optimization method referred to as sparse representation to obtain the parameters $w^j$, where $w^j=[w_1^j, w_2^j, \ldots w_k^j, \ldots w_m^j]^T$ represent the weighting of the contribution of all sensors in the road network in terms of contributing to the prediction task performed at sensor j. When $w_k^j=0$, the data from sensor k are totally not correlated to the data from sensor j. Otherwise, $w_k^j$ indicates the correlation degree between the data from sensor k and the data from sensor j, k=1,2, . . . ,m.

(e) Perform traffic flow prediction by applying the spatio-temporal correlated data as the input to the prediction model.

In certain embodiments of the present invention, three objectives to be optimized are shortlisted, denoted as (d1), (d2), and (d3), respectively, and the detailed implementation is as follows:

(d1) The objective to be optimized in the sparse representation is expressed as:

$$\hat{w}^j = \arg\min_{w^j} \|w^j\|_0 \quad \text{subject to} \quad \|Vw^j - v^j\|_2^2 = \sum_{i=1}^{n} \|V_i w^j - v_i^j\|^2 \leq \varepsilon_0$$

where $V=(V_1^T, V_2^T, \ldots V_n^T)^T$ represent the traffic flow data collected from all sensors from time 1 to time n, $V_i=[v_i^1, v_i^2, \ldots V_i^m]$ the traffic volumes achieved from the total m sensors at time i, i=1,2, . . . ,n, $v^j=[v_{\tau+1}^j, v_{\tau+2}^j, \ldots, v_{\tau+n}^j]^T$ the traffic volumes collected from sensor j from time $\tau+1$ to time $\tau+n$, $\|w^j\|_0$ the $l^0$ norm of $w^j$, say, the number of nonzero elements in vector $w^j$, and $\varepsilon_0$ a predefined threshold to confine the prediction error $\|V_w^j - v^j\|_2$, which is the $l^2$ norm of vector $Vw^j - v^j$, say, the squared root of the sum of the square of each element in the vector.

(d2) The objective to be optimized in the sparse representation is expressed as:

$$\hat{w}^j = \arg\min_{w^j} \|Vw^j - v^j\|_2^2 \quad \text{subject to} \quad \|w^j\|_0 \leq L_0$$

where $L_0$ is a predefined threshold to control the number of the nonzero elements in vector $w^j$ and the optimization can be implemented via the algorithm referred to as Orthogonal Matching Puisuit (OMP) [Tropp, J. A., 2004. Greed is good: algorithmic results for sparse approximation. IEEE Trans. Information Theory 50, 2231-2242].

(d3) The objective to be optimized in the sparse representation is expressed as:

$$\hat{w}^j = \arg\min_{w^j} \|w^j\|_1 \quad \text{subject to} \quad \|Vw^j - v^j\|_2^2 = \sum_{i=1}^{n} \|V_i w^j - v_i^j\|^2 \leq \varepsilon_0$$

where $\|w^j\|_1$ is the $l^1$ norm of $w^j$, say, the sum of the absolute value of every element in vector $w^j$, and $\varepsilon_0$ a predefined threshold to confine the prediction error $\|Vw_j - v^j\|_2$. By applying Lagrange multiplier $\lambda$ to the aforementioned constrained optimization task, it can be converted into the following unconstrained one:

$$\hat{w}^j = \arg\min_{w^j} \left\{ \lambda \|w^j\|_1 + \frac{1}{2} \|Vw^j - v^j\|_2^2 \right\}$$

which is solved through the algorithm referred to as Least Angle Regression Stagewise (LARS) [Efron, B., Hastie, T., Johnstone, I., Tibshirani, R. 2004. Least angle regression. Annals of Statistics 32(2), 407-499].

In certain embodiments of the present invention, apart from the multi-factor linear regression model, other models can also be employed as the predictor, for instance, Vector Autoregressive (VAR) model, back propagation (BP) neural network, and radical basis function (RBF) neural network.

The method of certain embodiments of the present invention can identify the correlated sensors in regard to the target sensor undergoing prediction from the whole road network in an automatic manner and applies the spatio-temporal correlated data achieved from such correlated sensors as the input to the predictor without human intervention to empirically confine the context of the input within a certain-range neighborhood around the target sensor. Therefore, by means of automatic spatio-temporal data mining, the method of certain embodiments of the present invention gains advantage over the existing models the input of which are manually selected from the neighborhood based on human experience.

For a fuller understanding of the nature and advantages of the present invention, reference should be made to the ensuing detailed description and accompanying drawings.

BRIEF DESCRIPTION OF THE DRAWINGS

FIG. 1 shows the flowchart of the method according to certain embodiments of the present invention.

DETAILED DESCRIPTION

In the following description, various embodiments of the present invention will be described. For purposes of explanation, specific configurations and details are set forth in order to provide a thorough understanding of the embodiments. However, it will also be apparent to one skilled in the art that the present invention may be practiced without the specific details. Furthermore, well-known features may be omitted or simplified in order not to obscure the embodiment being described.

As shown in FIG. 1, the traffic flow prediction method involved in certain embodiments of the present invention is composed of 5 steps, including data collection, data preprocessing, prediction model rendering, spatio-temporal data mining, and traffic flow prediction. In terms of data collection, the traffic volume data are collected by using the sensors distributed at the nodes all over the road network. In terms of data preprocessing, the raw data of traffic flows are preprocessed into valid traffic flow data. In terms of spatio-temporal data mining, it is a method to determine the spatio-temporal correlated data for the prediction task in an automatic manner by means of the optimization method referred to as sparse representation. In terms of traffic flow prediction, the prediction is performed by applying the spatio-temporal correlated data as the input to the prediction model. The detailed embodiments are as follows:

Embodiment 1

(Step 1) Data Collection: By means of the sensors distributed at the nodes all over the road network, the traffic volume data are collected per 30 seconds to record the data from every sensor in the whole road network, which is in the form of a matrix as follows:

$$S = \begin{bmatrix} s_1^1 & s_1^2 & \cdots & s_1^M \\ s_2^1 & s_2^2 & \cdots & s_2^M \\ \vdots & \vdots & \vdots & \vdots \\ s_N^1 & s_N^2 & \cdots & s_N^M \end{bmatrix}$$

where M is the number of all the sensors in the road network, N is the length of the time series with 30 seconds as the time unit, and $s_i^j$ is the traffic volume of 30 seconds of time i archived from sensor j.

(Step 2) Preprocessing: Adjust the time scale of the raw data from the time unit of 30 seconds to 10 minutes per time interval. Correspondingly, the data are reformatted into a matrix as follows:

$$\hat{V} = \begin{bmatrix} v_1^1 & v_1^2 & \cdots & v_1^M \\ v_2^1 & v_2^2 & \cdots & v_2^M \\ \vdots & \vdots & \vdots & \vdots \\ v_n^1 & v_n^2 & \cdots & v_n^M \end{bmatrix}$$

where $$v_i^j = \sum_{k=1}^{20} s_{(i-1)\times 20+k}^j \text{ and } n = \frac{N}{20}.$$

Then, compute the standard deviation of every column in $\hat{V}$ and let std(j) represent the standard deviation of the jth column. If std(j)<20, then, the records from sensor j are regarded as irrelevant data and remove the corresponding column from $\hat{V}$. As a result, the valid traffic flow data can be obtained, namely, $V \in R^{m \times n}$, where m is the number of the sensors involved in performing prediction after such preprocessing. Following the aforementioned preprocessing, the data used for traffic flow prediction becomes a matrix as follows:

$$V = \begin{bmatrix} v_1^1 & v_1^2 & \cdots & v_1^m \\ v_2^1 & v_2^2 & \cdots & v_2^m \\ \vdots & \vdots & \vdots & \vdots \\ v_n^1 & v_n^2 & \cdots & v_n^m \end{bmatrix}$$

(Step 3) Prediction model rendering: Let $v_i^j$ represent the traffic data collected by sensor j at time i. For the m sensors that take part in the prediction task, the state of whole road network at time i is $V_i = [v_i^1, v_i^2, \ldots V_i^m]$. The multi-factor linear regression model to predict the traffic volume at sensor j with time lag $\tau$ is:

$$\bar{v}_{i+\tau}^j = V_i w^j$$

where the weights $w^j = [w_1^j, w_2^j, \ldots w_m^j]^T$ are the parameters to be optimized, $\bar{v}_{i+\tau}^j$ is the predicted value with $\tau=1, 2, 3, 4, 5,$ and $6$. That is, the time lag to predict the traffic volume at sensor j is 10, 20, 30, 40, 50, and 60 minutes, respectively.

(Step 4) Spatio-temporal correlation mining: Sparse representation is applied to optimize the parameters $w^j$, where $w^j = [w_1^j, w_2^j, \ldots w_m^j]^T$ indicates the spatio-temporal correlation between the data of every sensor in the road network and the data of the target sensor undergoing prediction, say, sensor j. When $w_k^j = 0$, the data from sensor k is not correlated to the data from j. Otherwise, the value of $w_k^j$ reflects the correlation degree between the data from sensor k and the data from sensor j, k=1,2,...,m. After normalizing every column of V and $v^j = [v_{\tau+1}^j, v_{\tau+2}^j, \ldots, v_{n+\tau}^j]^T$ as follows, the followings are obtained:

$$V = \begin{bmatrix} \dfrac{v_1^1}{\sqrt{\sum\limits_{i=1}^{n}(v_i^1)^2}} & \dfrac{v_1^2}{\sqrt{\sum\limits_{i=1}^{n}(v_i^2)^2}} & \cdots & \dfrac{v_1^m}{\sqrt{\sum\limits_{i=1}^{n}(v_i^m)^2}} \\ \dfrac{v_2^1}{\sqrt{\sum\limits_{i=1}^{n}(v_i^1)^2}} & \dfrac{v_2^2}{\sqrt{\sum\limits_{i=1}^{n}(v_i^2)^2}} & \cdots & \dfrac{v_2^m}{\sqrt{\sum\limits_{i=1}^{n}(v_i^m)^2}} \\ \vdots & \vdots & \vdots & \vdots \\ \dfrac{v_n^1}{\sqrt{\sum\limits_{i=1}^{n}(v_i^1)^2}} & \dfrac{v_n^1}{\sqrt{\sum\limits_{i=1}^{n}(v_i^2)^2}} & \cdots & \dfrac{v_n^m}{\sqrt{\sum\limits_{i=1}^{n}(v_i^m)^2}} \end{bmatrix} \text{ and } \bar{v}^j =$$

$$\begin{bmatrix} \frac{v_{\tau+1}^j}{\sqrt{\sum_{i=1}^n (v_{\tau+i}^j)^2}} \\ \frac{v_{\tau+2}^j}{\sqrt{\sum_{i=1}^n (v_{\tau+i}^j)^2}} \\ \vdots \\ \frac{v_{\tau+n}^j}{\sqrt{\sum_{i=1}^n (v_{\tau+i}^j)^2}} \end{bmatrix}$$

The objective to be optimized by sparse representation is:

$$\hat{w}^j = \arg\min_{w^j} \|Vw^j - \bar{v}^j\|_2^2 \quad \text{subject to} \quad \|w^j\|_0 \le L_0$$

where $L_0$ is a predefined threshold to control the number of nonzero elements in $w^j$ and the optimization can be solved by using the algorithm referred to as Orthogonal Matching Puisuit (OMP) [Tropp, J. A., 2004. Greed is good: algorithmic results for sparse approximation. IEEE Trans. Information Theory 50, 2231-2242].

(Step 5) Apply the weights $\hat{w}^j$ solved from step 4 to the predictor established in step (3) to obtain the prediction results as follows:

$$\bar{v}_{i+\tau}^j = V_i w^j$$

where only the nonzero elements in $\hat{w}^j$ contribute to the prediction, corresponding with the spatio-temporal correlated sensors.

Embodiment 2

Except for step 4, the other steps are the same as the corresponding ones of embodiment 1.

(Step 4) After normalize every column of V and $v^j = [v_{\tau+1}^j, v_{\tau+2}^j, \ldots, v_{\tau+n}^j]^T$ as follows, we obtain $$V = \begin{bmatrix} \frac{v_1^1}{\sqrt{\sum_{i=1}^n (v_i^1)^2}} & \frac{v_1^2}{\sqrt{\sum_{i=1}^n (v_i^2)^2}} & \cdots & \frac{v_1^m}{\sqrt{\sum_{i=1}^n (v_i^m)^2}} \\ \frac{v_2^1}{\sqrt{\sum_{i=1}^n (v_i^1)^2}} & \frac{v_2^2}{\sqrt{\sum_{i=1}^n (v_i^2)^2}} & \cdots & \frac{v_2^m}{\sqrt{\sum_{i=1}^n (v_i^m)^2}} \\ \vdots & \vdots & & \vdots \\ \frac{v_n^1}{\sqrt{\sum_{i=1}^n (v_i^1)^2}} & \frac{v_n^2}{\sqrt{\sum_{i=1}^n (v_i^2)^2}} & \cdots & \frac{v_n^m}{\sqrt{\sum_{i=1}^n (v_i^m)^2}} \end{bmatrix} \text{ and } \bar{v}^j =$$

$$\begin{bmatrix} \frac{v_{\tau+1}^j}{\sqrt{\sum_{i=1}^n (v_{\tau+i}^j)^2}} \\ \frac{v_{\tau+2}^j}{\sqrt{\sum_{i=1}^n (v_{\tau+i}^j)^2}} \\ \vdots \\ \frac{v_{\tau+n}^j}{\sqrt{\sum_{i=1}^n (v_{\tau+i}^j)^2}} \end{bmatrix};$$

The objective to be optimized by sparser representation is:

$$\hat{w}^j = \arg\min_{w^j} \|w^j\|_1 \quad \text{subject to} \quad \|Vw^j - \bar{v}^j\|_2^2 = \sum_{i=1}^n \|V_i w^j - v_i^j\|^2 \le \varepsilon_0$$

where $\|w^j\|_1$ is the $l^1$ norm of $w^j$ to indicate the sum of the absolute value of every element in $w^j$, and $\varepsilon_0$ a predefined threshold to confine the prediction error $\|Vw^j - \bar{v}^j\|_2$, which means the $l^2$ norm of $Vw^j - \bar{v}^j$, that is, the square root of the sum of the square of every element in the vector. The objective to be optimized in the above expression is equal to the alternative unconstraint one after applying Lagrange multiplier $\lambda$:

$$\hat{w}^j = \arg\min_{w^j} \left\{ \lambda \|w^j\|_1 + \frac{1}{2} \|Vw^j - \bar{v}^j\|_2^2 \right\}$$

where the optimization is solved through the algorithm referred to as Least Angle Regression Stagewise (LARS) [Efron, B., Hastie, T., Johnstone, I., Tibshirani, R. 2004. Least angle regression. Annals of Statistics 32(2), 407-499]. When solving the optimization, the number of the nonzero elements in $\hat{w}^j$ is controlled by setting the value of $\lambda$, where we let $\lambda = 0.001$ according to the experience to obtain optimized parameters for the model.

Embodiment 3

Except for step 5, the other steps are the same as the corresponding ones in embodiment 2.

(Step 5) The prediction model is Vector Autoregressive (VAR) model [Chandra, S. R., Al-Deek, H., 2009. Predictions of freeway traffic speeds and volumes using vector autoregressive models. Journal of Intelligent Transportation Systems 13 (2), 53-72], computed as follows:

$$v_t^j = \sum_{d=1}^p \sum_{i=1}^m w_i^j \psi_i^j B^d v_t^i + u_t^j$$

where B means time delay operation, namely, $B^d v_t = v_{t-d}$. If sensor i is correlated to sensor j, that is, the ith element in the vector $\hat{w}^j$ solved from step 4 is not zero, then, let $\Psi_i^j = 1$. On the contrary, let $\Psi_i^j = 0$. $u_t^j$ denotes independent normal Gaussian noise. $w_i^j$ is the parameter to be optimized, which can be approached by using the maximum likelihood method based training.

Embodiment 4

Except for step 5, the other steps are the same as the corresponding ones in embodiment 2.

(Step 5) The prediction model is BP neural network (refer to [Bishop, Ch. M., 1995. Neural Networks for Pattern Recognition. Oxford university press, ISBN 0-19-853864-2]), where three-layer network structure is employed. The number of the neurons in the input layer is that of the nonzero elements in vector $\hat{w}^j$ solved from step 4 and the input data are from the sensors in correspondence to the nonzero elements in $\hat{w}^j$. The number of the neurons in the hidden layer is set to be 5 and that in the output layer to be 1. The transfer function in the hidden layer is bipolarity's function and that in the output layer is linear function.

Embodiment 5

Except for step 5, the other steps are the same as the corresponding ones in embodiment 2.

(Step 5) The prediction model is RBF neural networks (Refer to [Bishop, Ch. M., 1995. Neural Networks for Pattern Recognition. Oxford university press, ISBN 0-19-853864-2]), where Gaussian function is used as the kernel. The number of the neurons in the input layer is that of the nonzero elements in vector $\hat{w}^j$ solved from step 4 and the input data are from the sensors in correspondence to the nonzero elements in $\hat{w}^j$. The number of the neurons in the hidden layer is identical to that in the input layer.

Real-world data are used to evaluate the prediction performance of the methods implemented in embodiments 2, 3, 4, and 5. The data are from a Regional Transportation Management Center of Minnesota and available at the following web site: http://www.d.umn.edu/tkwon/TMCdata/TMCarchive.html, which are traffic volumes collected by thousands of loop detectors located on the Twin Cities Metro freeways. The experimental settings are as follows. The data for training are from 4 February to 14 Mar. 2012, 40 days in total, and the data for testing are from 15 Mar. 2012 to 3 Apr. 2012, 20 days in total. After preprocessing, we make use of the data from 3254 sensors distributed widely throughout the whole road network to predict the traffic volumes at 60 target sensors.

In addition, comparable experiments are conducted, where except for the scheme of selecting spatio-temporal correlated sensors, the other settings are totally the same as those in embodiments 2, 3, 4, and 5. In the comparable experiments, the correlated sensors are confined as the sensors within a certain range of the neighborhood around the target sensor of interest and selected empirically with human effort. Then, the data from such manually selected sensors are applied as the input to the predictors. Here, the number of the neighboring sensors can be 10, 15, 20, 25, and 30, respectively.

The experiments show that the spatio-temporal correlation mining method proposed in certain embodiments of the present invention improves the prediction performance in comparison with the methods the input of which are from the neighboring sensors selected based on human experience. The results are presented in Table 1-6, where "10, 15, 20, 25, 30" in the first row of each table refer to that the input data to the prediction model are from 10, 15, 20, 25, 30 neighboring sensors around the target sensor, respectively, and "sparse" means that the input data to the prediction model are from the spatio-temporal correlated sensors discovered automatically by using the sparse representation method presented in embodiment 2. In all the tables, the prediction accuracy is defined as follows [Min, W., Wynter, L., 2011. Real-time road traffic prediction with spatio-temporal correlations. Transportation Research Part C 19, 606-616]:

$$\text{Accuracy} = 1 - \frac{1}{n}\sum_{i=1}^{n}\left|\frac{v_i^j - \hat{v}_i^j}{v_i^j}\right| \times 100$$

where n denotes the total number of predicted values, $v_i^j$ the real traffic volume sampled at sensor j, and $v_i^{-j}$, the predicted value. What are listed in Table 1-6 are the average of the prediction accuracies obtained at the 60 target sensors.

TABLE 1

The prediction accuracy of 10-minute time lag with input from 10, 15, 20, 25, 30 neighboring sensors and sparse representation selected sensors, as correlated sensors:

| | #Correlated sensors | | | | | |
|---|---|---|---|---|---|---|
| | 10 | 15 | 20 | 25 | 30 | Sparse |
| Linear regression | 85.69 | 85.95 | 86.12 | 86.23 | 86.27 | 88.59 |
| BP neural network | 87.23 | 87.49 | 87.45 | 87.63 | 87.59 | 88.16 |
| RBF neural network | 86.71 | 86.98 | 87.01 | 86.96 | 86.85 | 88.17 |
| Vector Autoregressive Model | 87.39 | 87.39 | 87.42 | 87.43 | 87.46 | 87.82 |

TABLE 2

The prediction accuracy of 20-minute time lag with input from 10, 15, 20, 25, 30 neighboring sensors and sparse representation selected sensors, as correlated sensors:

| | #Correlated sensors | | | | | |
|---|---|---|---|---|---|---|
| | 10 | 15 | 20 | 25 | 30 | Sparse |
| Linear regression | 83.50 | 83.61 | 83.85 | 83.94 | 84.02 | 86.75 |
| BP neural network | 85.43 | 85.56 | 85.51 | 85.80 | 85.79 | 86.25 |
| RBF neural network | 84.92 | 85.11 | 84.93 | 84.60 | 84.97 | 86.39 |
| Vector Autoregressive Model | 85.38 | 85.32 | 85.38 | 85.34 | 85.42 | 85.71 |

TABLE 3

The prediction accuracy of 30-minute time lag with input from 10, 15, 20, 25, 30 neighboring sensors and sparse representation selected sensors, as correlated sensors:

| | #Correlated sensors | | | | | |
|---|---|---|---|---|---|---|
| | 10 | 15 | 20 | 25 | 30 | Sparse |
| Linear regression | 82.05 | 82.20 | 82.43 | 82.50 | 82.63 | 85.88 |
| BP neural network | 84.31 | 84.55 | 84.69 | 84.68 | 84.95 | 85.67 |
| RBF neural network | 83.76 | 84.01 | 83.91 | 83.70 | 84.04 | 85.52 |
| Vector Autoregressive Model | 83.89 | 83.84 | 83.88 | 83.89 | 83.98 | 84.69 |

TABLE 4

The prediction accuracy of 40-minute time lag with input from
10, 15, 20, 25, 30 neighboring sensors and sparse representation
selected sensors, as correlated sensors:

| | #Correlated sensors | | | | | |
|---|---|---|---|---|---|---|
| | 10 | 15 | 20 | 25 | 30 | Sparse |
| Linear regression | 80.49 | 80.62 | 80.81 | 80.89 | 81.01 | 84.99 |
| BP neural network | 83.16 | 83.43 | 83.64 | 83.58 | 83.76 | 85.08 |
| RBF neural network | 82.32 | 82.68 | 82.65 | 82.49 | 82.88 | 85.15 |
| Vector Autoregressive Model | 82.07 | 82.05 | 82.15 | 82.17 | 82.22 | 84.10 |

TABLE 5

The prediction accuracy of 50-minute time lag with input from
10, 15, 20, 25, 30 neighboring sensors and sparse representation
selected sensors, as correlated sensors:

| | #Correlated sensors | | | | | |
|---|---|---|---|---|---|---|
| | 10 | 15 | 20 | 25 | 30 | Sparse |
| Linear regression | 79.18 | 79.29 | 79.52 | 79.55 | 79.74 | 84.26 |
| BP neural network | 82.12 | 82.50 | 82.67 | 82.83 | 83.15 | 84.88 |
| RBF neural network | 81.19 | 81.69 | 81.63 | 81.56 | 81.88 | 84.43 |
| Vector Autoregressive Model | 80.55 | 80.48 | 80.59 | 80.61 | 80.68 | 83.44 |

TABLE 6

The prediction accuracy of 60-minute time lag with input from
10, 15, 20, 25, 30 neighboring sensors and sparse representation
selected sensors, as correlated sensors

| | #Correlated sensors | | | | | |
|---|---|---|---|---|---|---|
| | 10 | 15 | 20 | 25 | 30 | Sparse |
| Linear regression | 77.97 | 78.06 | 78.32 | 78.32 | 78.53 | 83.92 |
| BP neural network | 81.58 | 81.98 | 82.15 | 82.22 | 82.46 | 84.42 |
| RBF neural network | 80.31 | 80.89 | 81.08 | 80.98 | 81.33 | 84.33 |
| Vector Autoregressive Model | 79.08 | 79.09 | 79.22 | 79.25 | 79.34 | 82.94 |

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A method for traffic flow prediction based on data mining on spatio-temporal correlations, comprising:
   (a) collecting raw data of traffic flows through sensors distributed at nodes located along a road network;
   (b) preprocessing the collected raw data into a valid form of traffic flow data;
   (c) establishing a prediction model, comprising: letting $v_i^j$ represent traffic volume data sampled at sensor j at time i; supposing that there are in total m sensors in a road network; denoting the state of the whole road network at time i as $V_i=[v_i^1, v_i^2, \ldots V_i^m]$; and using a linear regression model to predict the traffic volume data collected at senor j with time lag $\tau$ as follows:

$$\bar{v}_{i+\tau}^j = V_i w^j$$

wherein weights $w^j=[w_1^j, w_2^j, \ldots w_k^j, \ldots w_m^j]^T$ are parameters to be optimized and $\bar{v}_{i+\tau}^j$ is the predicted traffic volume;
   (d) mining spatio-temporal correlations, comprising: applying a sparse representation as an optimization method to obtain the parameters $w^j$, wherein $w^j=[w_1^j, w_2^j, \ldots w_k^j, \ldots w_m^j]^T$ represent the spatio-temporal correlations between the traffic flow data from each sensor in the whole road network and the data from the target sensor j undergoing prediction; wherein when $w_k^j=0$, the data from sensor k are not correlated to the data from sensor j; wherein otherwise, $w_k^j$ indicates the correlation degree between the data from sensor k and the data from sensor j, k=1,2, . . . ,m; and
   (e) performing traffic flow prediction by applying the spatio-temporal correlated data as the input to the prediction model.

2. The method of claim 1, wherein the objective to be optimized in the sparse representation at (d) is:

$$\hat{w}^j = \arg\min_{w^j} \|w^j\|_0 \text{ subject to } \|Vw^j - v^j\|_2^2 = \sum_{i=1}^{n} \|V_i w^j - v_i^j\|^2 \leq \varepsilon_0$$

wherein $V=(V_1^T, V_2^T, \ldots V_n^T)^T$ denotes the traffic flow data collected from the sensors from time 1 to time n; $V_i=[v_i^1, v_i^2, \ldots, v_i^m]$ denotes traffic volumes achieved from the total m sensors at time i, i=1,2, . . . ,n; $v^j=[v_{\tau+1}^j, v_{\tau+2}^j, \ldots, v_{n+\tau}^j]^T$ denotes the traffic volumes collected from sensor j from time $\tau+1$ to time $\tau+n$; $\|w^j\|_0$ denotes the $l^0$ norm of $w^j$, that is, the number of nonzero elements in vector $w^j$; and $\epsilon_0$ denotes a predefined threshold to confine the prediction error $\|Vw^j-v^j\|_2$, which is the $l^2$ norm of vector $Vw^j-v^j$, that is, the squared root of the sum of the square of each element in the vector.

3. The method of claim 1, wherein the objective to be optimized in the sparse representation in step (d) is:

$$\hat{w}^j = \arg\min_{w^j} \| Vw^j - v^j \|_2^2 \quad \text{subject to} \quad \| w^j \|_0 \leq L_0$$

wherein $L_0$ is a predefined threshold to control the number of the nonzero elements in vector $w^j$ and the objective to be optimized can be solved via Orthogonal Matching Pursuit (OMP) algorithm.

4. The method of claim 1, wherein the objective to be optimized in the sparse representation in step (d) is $$\hat{w}^j = \arg\min_{w^j} \| w^j \|_1 \quad \text{subject to} \quad \| Vw^j - v^j \|_2^2 = \sum_{i=1}^{n} \| V_i w^j - v_i^j \|^2 \leq \varepsilon_0$$

wherein $\|w^j\|_1$ is the $l^1$ norm of $w^j$, indicating the sum of the absolute value of each element in vector $w^j$; $\epsilon_0$ indicates a predefined threshold to confine the prediction error $\|Vw^j-v^j\|_2$, and said objective to be optimized can be equivalently expressed as the following unconstrained one by applying Lagrange multiplier $\lambda$:

$$\hat{w}^j = \arg\min_{w^j} \left\{ \lambda \| w^j \|_1 + \frac{1}{2} \| Vw^j - v^j \|_2^2 \right\}$$

which is solved through a Least Angle Regression Stagewise (LARS) algorithm.

* * * * *